(12) United States Patent
Yamazaki

(10) Patent No.: US 7,220,988 B2
(45) Date of Patent: May 22, 2007

(54) LUMINESCENT DEVICE AND PROCESS OF MANUFACTURING THE SAME

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 115 days.

(21) Appl. No.: 11/183,819

(22) Filed: Jul. 19, 2005

(65) Prior Publication Data

US 2005/0264193 A1    Dec. 1, 2005

Related U.S. Application Data

(63) Continuation of application No. 10/128,550, filed on Apr. 24, 2002, now Pat. No. 6,933,673.

(30) Foreign Application Priority Data

Apr. 27, 2001    (JP)    ............... 2001-133554

(51) Int. Cl.
*H01L 29/08* (2006.01)
(52) U.S. Cl. ..................... 257/40; 257/72; 313/506
(58) Field of Classification Search ............... 257/40, 257/72
See application file for complete search history.

(56) References Cited

U.S. PATENT DOCUMENTS

| | | | |
|---|---|---|---|
| 5,153,073 A | 10/1992 | Ohnuma et al. | |
| 5,550,066 A | 8/1996 | Tang et al. | |
| 5,608,421 A | 3/1997 | Okada | |
| 5,719,467 A | 2/1998 | Antoniadis et al. | |
| 5,885,498 A | 3/1999 | Matsuo et al. | |
| 5,895,692 A | 4/1999 | Shirasaki et al. | |
| 6,075,316 A | 6/2000 | Shi et al. | |
| 6,346,717 B1 | 2/2002 | Kawata | |
| 6,396,468 B2 | 5/2002 | Matsushima et al. | |
| 6,416,885 B1 | 7/2002 | Towns et al. | |
| 6,423,429 B2 | 7/2002 | Kido et al. | |
| 6,597,121 B2 | 7/2003 | Imura | |
| 6,630,784 B2 | 10/2003 | Yoneda | |
| 2001/0017517 A1 | 8/2001 | Yamazaki | |
| 2001/0026123 A1 | 10/2001 | Yoneda | |
| 2002/0180372 A1 | 12/2002 | Yamazaki | |

FOREIGN PATENT DOCUMENTS

| | | |
|---|---|---|
| JP | 11-251067 | 9/1999 |
| JP | 11-251069 | 9/1999 |
| JP | 2000-244079 | 9/2000 |
| JP | 32-03227 | 8/2001 |
| JP | 32-24459 | 10/2001 |

*Primary Examiner*—Andy Huynh
*Assistant Examiner*—Earl N. Taylor
(74) *Attorney, Agent, or Firm*—Fish & Richardson P.C.

(57) ABSTRACT

An object is to improve the element characteristic of a luminescent element. In an anode 122 connected to a drain interconnection 120 of a current-controlling TFT 202, slits are made. A transparent hole generating layer 124 is formed on the anode 122. Since the slits are made, luminescence can be taken out even if a light-shielding metal film is used as the anode 122. Since the hole generating layer 124 has semi-conductivity, an electric field applied from the anode 122 to an organic compound layer 125 can be made uniform. Since holes are generated in the hole generating layer 124, the density of carriers injected from the anode 122 can be made high. In this way, a luminescent element having a low driving voltage and a high brightness can be manufactured.

20 Claims, 11 Drawing Sheets

LUMINESCENT DEVICE AND PROCESS OF MANUFACTURING THE SAME

CROSS-REFERENCE TO RELATED APPLICATIONS

This application is a continuation application of U.S. application Ser. No. 10/128,550, filed Apr. 24, 2002, now U.S. Pat. No. 6,933,673, which claims the benefit of a foreign priority application filed in Japan as Serial No. 2001-133554 on Apr. 27, 2001. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a luminescent device using a luminescent element having a film comprising an organic compound which can give fluorescence or luminescence by the application of an electric field (hereinafter referred to as an "organic compound layer"), and a process of manufacturing the same.

In the present invention, the luminescent element means an element wherein an organic compound layer is arranged between a pair of electrodes, and the luminescent device means an image display device or a light-emitting device using the luminescent element. The category of the luminescent device includes all of modules wherein a connector such as a flexible printed circuit (FPC), a tape automated bonding (TAB), or a tape carrier package (TCP) is attached to the luminescent element, modules wherein a printed circuit is attached to the tip of the TAB tape or the TCP, and modules wherein an IC (integrated circuit) is mounted directly to the luminescent element in a chip on glass (COG) manner.

2. Description of Related Art

Luminescent elements using an organic compound as a luminescent body and having characteristics such as thin and light bodies, high-speed responsibility and the capability of being driven by low DC voltage are expected to be applied to flat panel displays in the next generation. Particularly a display device wherein luminescent elements are arranged in a matrix form is superior to conventional liquid crystal display devices in wide field angle and the easiness of being watched.

The luminescent mechanism of a luminescent element is said to be based on the following: by applying voltage to its electrode-pair through its organic compound layer, electron injected from the cathode and holes injected from the anode are recombined in the luminescent center of the organic compound layer to produce molecular excitons, and energy is emitted when the molecular excitons return to their ground state. As excitation state, singlet excitation and triplet excitation are known. It is considered that luminescence can be caused whether the molecular excitons undergo the singlet excitation or the triplet excitation.

In a luminescent device formed by arranging such luminescent elements in a matrix form, a driving method called passive matrix driving (simple matrix type) or active matrix driving (active matrix type) can be used. However, when pixel density increases, it is considered that the active matrix type, wherein a switch is fitted to each of pixels (or dots), is more profitable since this type device can be driven at a lower voltage.

In the manufacture of a luminescent device of the active matrix type, a thin film transistor (hereinafter referred to as a TFT) is formed on an insulating surface, an interlayer dielectric is formed on the TFT, and then an anode of a luminescent element electrically connected through the interlayer dielectric to the TFT is formed. For the material which makes the anode, a transparent conductive material having a large work function is suitable. A typical example thereof is indium tin oxide (ITO).

Furthermore, an organic compound layer is formed on the anode. The organic compound layer includes a hole injection layer, a hole transport layer, a luminescent layer, a blocking layer, an electron transport layer, an electron injection layer and so on. The organic compound layer may have a monolayer structure or a multilayer structure wherein the above-mentioned layers are combined.

After the formation of the organic compound layer, a luminescent element is formed by forming a cathode. In many cases, the material of the cathode is any one of metals having a small work function (typically, metals belonging to the I or II group in the periodic table) or an alloy containing these metals.

An insulating layer made of an organic resin material is formed to cover the edge of the anode and prevent a short circuit between the anode and the subsequently-formed cathode. A luminescent element as described above is formed in each pixel. These luminescent elements are formed in a pixel section, whereby an active matrix type luminescent device is manufactured.

Since the transparent conductive film which has been used so far as the anode can transmit visible rays, this film can transmit light generated in the luminescent layer. However, this film has a drawback that the resistivity thereof is larger than that of metals. As the resistance of the film becomes larger, the injection of carriers becomes more difficult. Therefore, a problem that the carrier-recombining ability of the luminescent element deteriorates occurs.

SUMMARY OF THE INVENTION

Thus, an object of the present invention is as follows: by using a material which can transmit light in the same way as the transparent conductive film which has been used so far as the anode and further has a lower resistance than the transparent conductive film, the device property of a luminescent device is made higher than in the conventional cases using the transparent conductive film.

According to the present invention, in order to solve the above-mentioned problems, a conductive material having a low resistance is used to form an anode having slits (slender gaps for not blocking light), whereby a light-shielding metal film can be used as an electrode material. In this way, it is possible to form an anode which can transmit light generated in a luminescent layer in the same way as the transparent conductive film, and has a lower resistance than the transparent conductive film.

By forming the anode having the slits, the area of the anode becomes small to result in a problem that an electric field is not uniformly applied to an organic compound layer and thus sufficient luminescence cannot be obtained. In the present invention, therefore, a semiconductor film composed of an organic material having high transparency and an electron receptor is formed on concave portions and convex portions in slits of an anode. The film having electrical conductivity between that of conductors and that of insulators (referred to as semiconductivity in the present specification) is called the semiconductive film herein. Since the semiconductive film can be caused to function as a part of the electrode in this way, an electric field can be uniformly applied to the organic compound layer. Furthermore, by making the surface of the semiconductive film flat and smooth, subsequently a hole injection layer, a hole transport layer, a luminescent layer and an electron transport layer can be uniformly formed.

In the present invention, the semiconductive film is formed by co-evaporating an organic material and an electron receptor. Between the organic material and the electron receptor, electric charges are transferred by withdrawing electrons which the organic material has, so that holes can be generated from the organic material. Therefore, when the holes are injected by the application of voltage from the anode, the density of the flowing holes can be made high. In the specification, a layer made of the semiconductive film is called a hole generating layer. This layer is included in the category of the organic compound layer composed of a hole injection layer, a hole transport layer, a luminescent layer, an electron transport layer, a blocking layer and so on.

The function of the anode is to inject holes into the organic compound layer when voltage is applied thereto. The material of the anode is required to have a higher HOMO level than the organic compound making the organic compound layer. That is, the anode material is desirably a material having a large work function. Since it is desired in the present invention that the resistance of the anode is made lower, the anode material is required to have a lower resistance than ITO. As the anode material, there may be used a metal material such as platinum (Pt), chromium (Cr), tungsten (W), or nickel (Ni).

It is desirable in the present invention that the interval between the slits which the anode has (i.e., the distance between the adjacent slits) is from 0.5 to 3 μm (preferably, from 1.0 to 2.0 μm) and the width of the slits is 5 to 15 times larger than the interval between the slits. For example, in the case that the interval between the slits is 1.5 μm, the width of the slits is desirably from 10 to 15 μm. It is advisable to set the percentage of the area where the slits are formed in the area where the anode is formed to 70–90%. These conditions have been found out by the present inventor, in order to solve the following conflicting problems: a problem that when the anode area becomes small by forming the slits, the voltage applied from the anode to the organic compound layer becomes uneven so that the organic compound layer is deteriorated by the concentration of an electric field: and a problem that an opening must be made to transmit light from the side of the anode.

As the highly-transparent organic material for forming the semiconductive film in the present invention, a low molecule material or a high molecule material can be used. The low molecule material referred to herein means a material having a lower molecular weight than that of the high molecular material made of polymer.

In the case that the semiconductive film is made of a low molecule material, this film is formed by co-evaporating an electron receptor such as tetracyano-quinodimethane (TCNQ), $FeCl_3$, $ZrCl_4$, $HfCl_4$, $NbCl_5$, $TaCl_5$, $MoCl_5$ or $WCl_6$ with the low molecule material, for example, a condensed ring hydrocarbon (such as anthracene, tetracene or pyrene), normal paraffin, oligothiophene material, or phthalocyanine material.

On the other hand, in the case that the semiconductive film in the present invention is made of a high molecule material, this film is formed by incorporating the high molecule material and an electron receptor such as $PF_6^-$, bromine or iodine into a solvent and making the resultant solution into a film form by printing, inkjet coating or spin coating. Examples of the high molecule material include polyacetylene, polythiophene, poly(3-methyl)thiophene, poly(3-ethyl)thiophene, poly(3-n-butyl)thiophene, poly(3-hexyl)thiophene, poly(3-octyl)thiophene, poly(3-dodecyl) thiophene, poly(3-octadecyl)thiophene, poly(3-eicosyl) thiophene, and poly(3-methyl-Co-butyl)thiophene.

By carrying out the present invention in the above-mentioned way, a metal material having light-shielding ability and low resistance can be used. Therefore, the scope from which the material which can be used as the anode material is selected becomes wide. By forming a hole generating layer on the anode where the slits are made, an organic compound layer which is to be formed in the next step can be homogeneously formed. Moreover, an electric field can be uniformly applied to the organic compound layer.

Since the hole generating layer is a layer for generating holes, the density of holes flowing when voltage is applied from the anode so that the holes are injected can be made high. Therefore, a luminescent element having a higher luminescent brightness and a lower driving voltage than conventional luminescent elements can be formed. By using, as a display section, a luminescent device having such a luminescent element, a high-performance electric apparatus can be obtained.

Luminescence obtained from the luminescent device of the present invention is luminescence based on either of singlet excitation state or triplet excitation state, or is luminescence based on both thereof.

PREFERRED EMBODIMENTS OF THE INVENTION

Referring to FIGS. 1A to 1E, the process of manufacturing a pixel section of a luminescent device, and the structure thereof will be described as embodiments of the present invention.

Figure 1A:
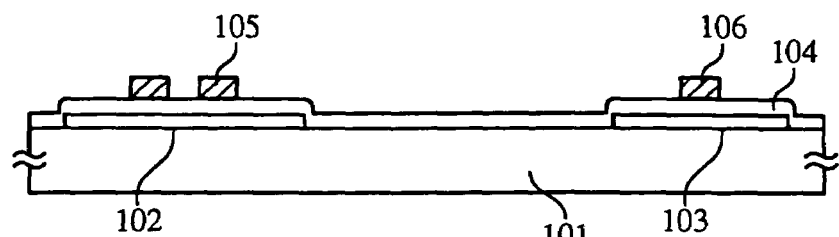
FIGS. 1A to 1E are views illustrating steps of manufacturing a luminescent device.

As illustrated in FIG. 1A, semiconductor elements are formed on a substrate 101. In the present embodiment, as the substrate 101, a glass substrate is used. A quartz substrate, a silicon substrate, a metal substrate or a ceramic substrate may be used.

The following will describe a case in which thin film transistors (TFTs) will be formed as semiconductor elements.

First, a crystalline silicon film is formed to have a film thickness of 50 nm. As the method of forming the crystalline silicon film, a known method can be used.

The crystalline silicon film is patterned into island-form crystalline silicon films 102 and 103 (hereinafter referred to as active layers). A gate insulting film 104 made of silicon oxide is formed to cover the active layers 102 and 103. Furthermore, gate electrodes 105 and 106 are formed on the gate insulating film 104. As the material which makes the gate electrodes 105 and 106, a tungsten film or a tungsten alloy film having a film thickness of 350 nm is used. As illustrated in FIG. 3, the gate electrode 105 is a part of a gate interconnection 301.

Figure 1B:
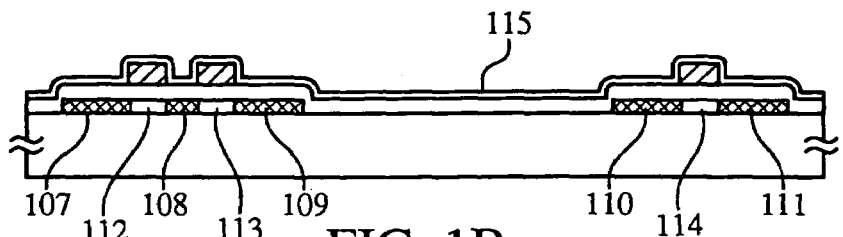

As illustrated in FIG. 1B, the gate electrodes 105 and 106 are used as masks to add an element belonging to the XIII group in the periodic table (typically, boron) The method of the addition may be a known method. In this way, impurity regions of a p-conductive type (referred to as p-type impurity regions) 107 to 111 are formed. Channel formed regions 112 to 114 are laid out just below the gate electrodes 105 and 106. The p-type impurity regions 107 to 111 become source regions or drain regions of TFTs.

Next, a protective film (a silicon nitride film herein) 115 is formed to have a thickness of 50 nm. Thereafter, the added element belonging to the XIII group in the periodic table is activated by heat treatment. This activation may be performed by furnace annealing, laser annealing or lamp annealing, or combination thereof. In the present embodiment, heat treatment is performed at 500° C. for 4 hours.

It is effective to perform hydrogenation treatment after the end of the activation. For the hydrogenation treatment, it is advisable to use known hydrogen annealing technique or plasma hydrogenation technique.

Figure 1C:
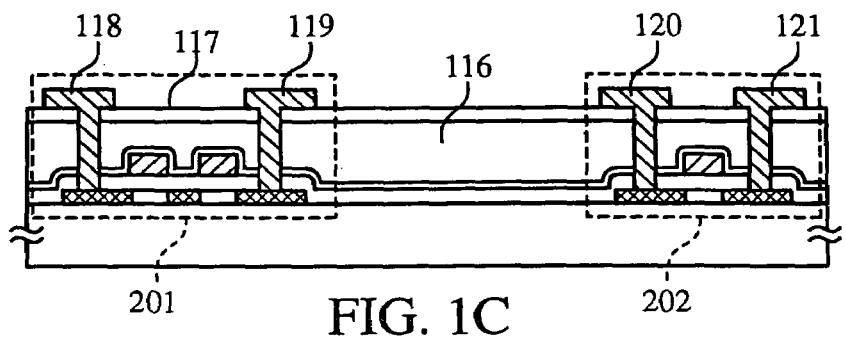

As illustrated in FIG. 1C, next, a first interlayer dielectric 116 made of an organic resin such as polyimide, polyacrylic or polyimideamide is formed to have a thickness of 800 nm. By applying this material onto the surface with a spinner, heating the material and firing or polymerizing the material to form the film 116, the surface of this film can be made flat and smooth. Since the organic resin material generally has a low dielectric constant, parasitic capacitance can be reduced. As the first interlayer dielectric 116, an inorganic insulating film may be used.

Next, a second interlayer dielectric 117 is formed on the first interlayer dielectric 116 in such a manner that gas released from the first interlayer dielectric 116 produces a bad effect on luminescent elements. The second interlayer dielectric 117 may be an inorganic insulating film, typical examples of which include a silicon oxide film, a silicon oxynitride film, a silicon nitride film, or a lamination film wherein these films are combined. The second interlayer dielectric 117 is formed by plasma CVD at a reaction pressure of 20 to 200 Pa and a substrate temperature of 300 to 400° C., using electric discharge based on high-frequency (13.56 MHz) having an electric power density of 0.1 to 1.0 W/cm². Alternatively, the surface of the interlayer dielectric is subjected to plasma treatment to form a hardened film containing one or more selected from hydrogen, nitrogen, carbon halides, hydrogen fluoride and rare gases.

Thereafter, a resist mask having a desired pattern is formed to make contact holes reaching the drain regions of TFTs, and interconnections 118 to 121 are formed. As the interconnection material, a conductive metal such as Al or Ti, or an alloy material thereof is used. By sputtering or vacuum evaporation, a film for the interconnections is formed, and subsequently this film is patterned into a desired shape.

In this state, TFTs are completed. As illustrated in FIG. 1C, in the pixel section of the luminescent device in the present embodiment, a switching TFT 201 and a current-controlling TFT 202 are formed, and at the same time an erasing TFT 203 is formed. The gate electrode of the erasing TFT 203 is made of a part of a gate interconnection 302, which is different from a gate interconnection 301 making the gate electrode of the switching TFT 201. In the present embodiment, all of these TFTs are p-channel type TFTs.

As illustrated in FIG. 3, at the same time, a retention capacitor 305 is formed. The retention capacitor 305 is composed of a lower retention capacitor composed of a semiconductor layer 306 formed at the same time when the active layer of the TFTs is formed, the gate insulating layer 104 and the interconnection making the gate electrode 106, and an upper retention capacitor composed of the interconnection making the gate electrode 106, the protective film 115, the first interlayer dielectric 116, the second interlayer dielectric 117 and a current-supplying line 304. The semiconductor layer is electrically connected to the current-supplying line 304.

Next, a conductive film which becomes anodes of luminescent elements is formed. It is possible to use, for the conductive film, a material which has a larger work function than a material making cathodes, and has a lower sheet resistance than an ITO film. Specific examples thereof include platinum (Pt), chromium (Cr), tungsten (W), and nickel (Ni). In this case, the film thickness of the conductive film is desirably set to 10 to 100 nm.

Figure 1D:
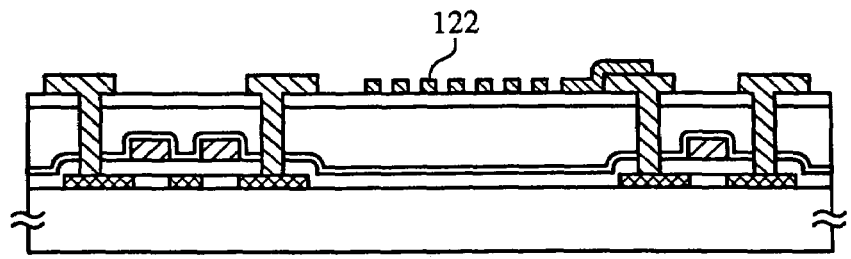

Subsequently, as illustrated in FIG. 1D, the conductive film is etched to form anodes 122 in which slits are made. When this state is viewed from the above, a configuration as illustrated in FIG. 3A can be viewed.

Figure 3A:
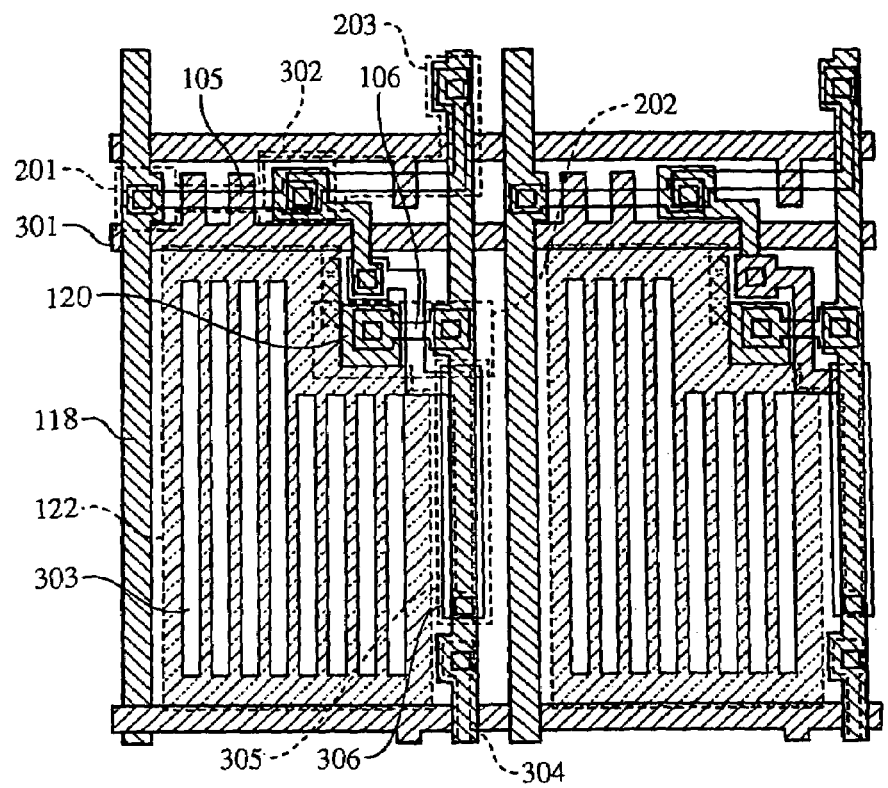
FIGS. 3A and 3B are views illustrating a circuit configuration of the luminescent device.
Figure 3B:
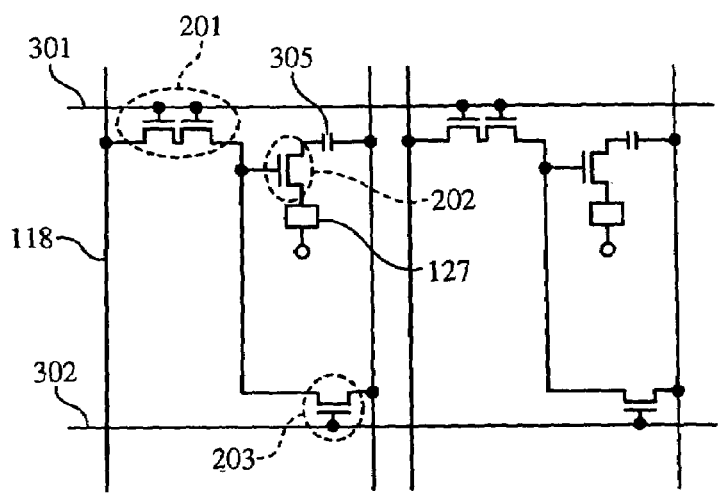

As illustrated in FIG. 3A, each of the anodes has a plurality of the slits 303. Even when the material making the anodes 122 is a light-shielding material, light can be transmitted through the slits 303.

In the present embodiment, the interval between the slits 303 (the distance shown by A in FIG. 3A) is set to 2 µm, and the width of the slits 303 (the distance shown by B in FIG. 3A) is set to 20 µm.

Thereafter, an organic resin film made of polyimide, polyacrylic resin, or polyimideamide is formed on the entire surface. The resin which can be adopted may be a thermosetting material, which is set by heating, or a photosensitive material, which is set by irradiation thereof with ultraviolet rays. In the case that the thermosetting material is used, a mask made of a resist is subsequently formed and then an insulating film 123 having openings on the anodes 122 is formed by dry etching. In the case that the photosensitive material is used, a photo mask is used to perform exposure to light and development, thereby forming an insulating film 123 having openings on the anodes 122. In either case, the insulating layer 123 is formed to cover the edge portions of the anodes 122 and have tapered edges. By making the edges into the tapered form, the coatability of an organic compound layer which will be formed later can be improved.

Next, a hole generating layer 124 is formed on the anodes 122. The hole generating layer 124*in* the present invention is a film having light-transmissivity, and can be formed by co-evaporating a low molecule material 124*a* as organic material and an electron receptor 124*b*. As the low molecule material, there may be used a condensed-ring hydrocarbon such as anthracene, tetracene or pyrene, normal paraffin, oligothiophene material, phthalocyanine material or the like. As the electron receptor, there may be used tetracyano quinodimethane (TCNQ), $FeCl_3$, $ZrCl_3$, $HfCl_4$, $NbCl_5$, $TaCl_5$, $MOCl_5$, $WCl_6$ or the like.

When the hole generating layer 124 is formed, the ratio by mole of the low molecule material 124a to the electron receptor 124b is desirably 1/1.

Figure 1E:
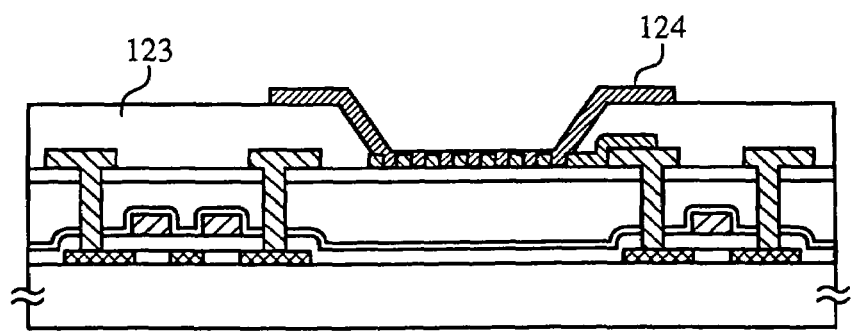

By forming the hole generating layer by evaporation using a metal mask, the hole generating layer 124 can be patterned into a form as illustrated in FIG. 1E. As described above, the hole generating layer 124 is formed. The hole generating layer 124 is deposited on not only the anodes but also the portions of the slits.

Figure 2A:
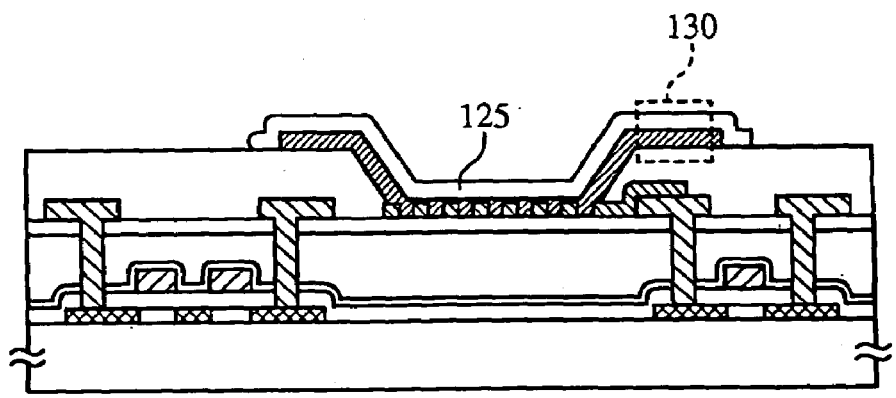
FIGS. 2A to 2C are views illustrating steps of manufacturing the luminescent device.

After the formation of the hole generating layer 124, an organic layer 125 wherein plural layers such as a luminescent layer, a hole injection layer, a hole transport layer, a hole barrier layer, an electron transport layer, an electron injection layer, and a buffer layer are combined and laminated is formed. The organic layer 125 is formed to have a thickness of about 20 to 300 nm (FIG. 2A). In the present embodiment, a combination of the hole generating layer 124 and the organic layer 125 is called an organic compound layer 130.

Figure 2B:
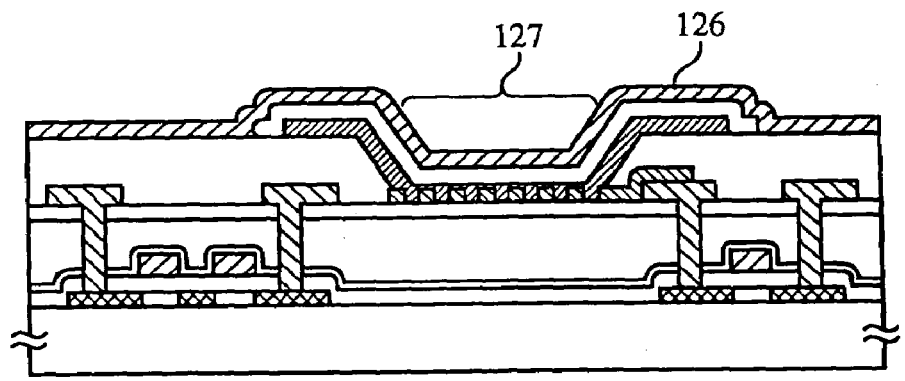

Next, cathodes 126 are formed by evaporation (FIG. 2B). As the material which makes the cathodes 126, there may be used a MgAg alloy, an AlLi alloy, or a film formed by co-evaporating aluminum and a simple element belonging to the I or II group in the periodic table or a compound containing the simple element (CaF, BaF or the like). The film thickness of the cathodes 126 is preferably from about 80 to 200 nm.

Figure 4:
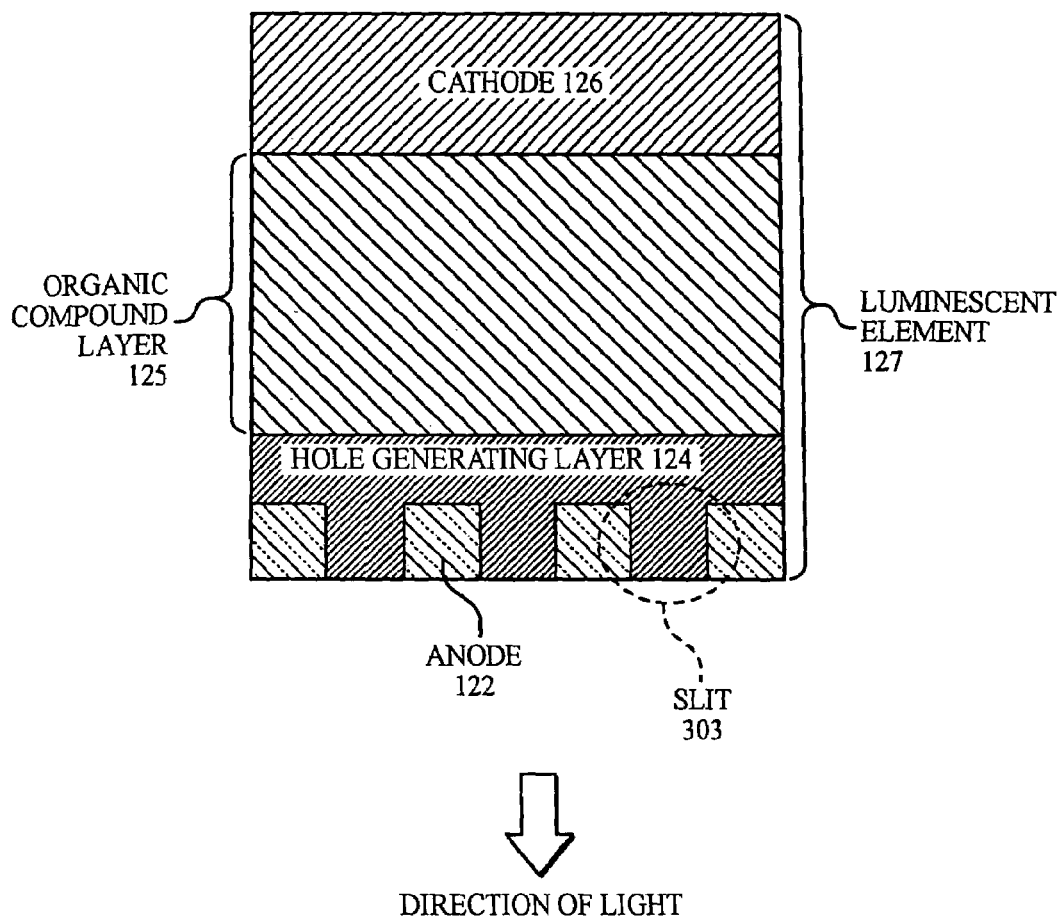
FIG. 4 is an element structure of a luminescent element.

As described above, a luminescent element 127 composed of the anode 122 having the slits 303, the organic compound layer 130 and the cathode 126 can be completed as illustrated in FIG. 4.

By forming the anode 122 having the slits and the hole generating layer 124 having light-transmissivity on the anode 122 in the above-mentioned way to have a thickness of about 20 to 200 nm, preferably about 20 to 50 nm, a conductive film having a low resistance but having bad light-transmissivity can be used as the conductive film making the anode 122. Moreover, by forming the hole generating layer 124 on the anode 122, the capability of injecting holes from the anode to the organic compound layer 125 can be improved so that the property of the present element can be improved.

Furthermore, by forming, on the anode 122 having irregularities based on the slits, the hole generating layer 124 which is thicker than the anode 122, the surface of the layer 124 is made flat and smooth in the present invention. As a result, the subsequently-formed organic compound layer 125 other than the hole generating layer 124 can be homogeneously formed. Thus, it is possible to prevent dark spots or a defect that the luminescent element 127 is not lighted because of a short circuit between the anode 122 and the cathode 126.

Figure 2C:
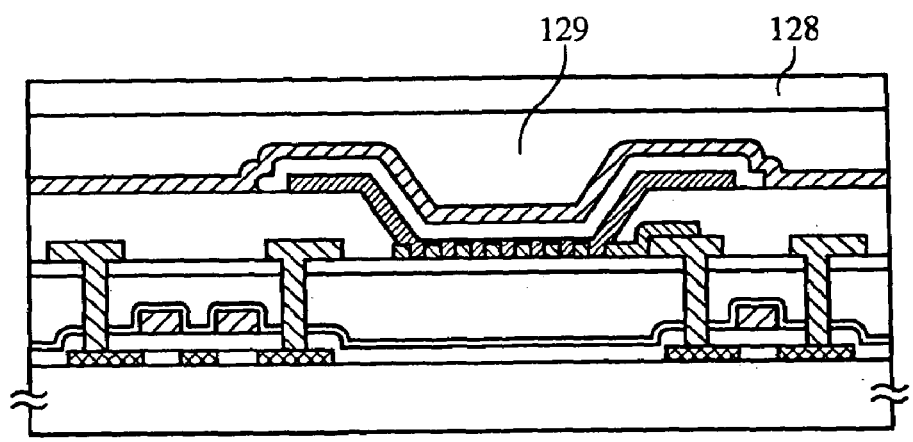

Furthermore, the luminescent element 127 is airtightly confined in a space 129 with a covering material 128 or the like, as illustrated in FIG. 2C. In this way, the luminescent element 127 is completely shut out from the outside to prevent invasion of materials promoting deterioration of the organic compound layer, such as water content or oxygen, from the outside.

As the material making the cover material 128, there may be used a glass substrate, a quartz substrate, or a plastic substrate made of fiber glass-reinforced plastic (FRP), polyvinyl fluoride (PVF), mylar, polyester or polyacrylic resin.

EXAMPLES

Example 1

Figure 5:
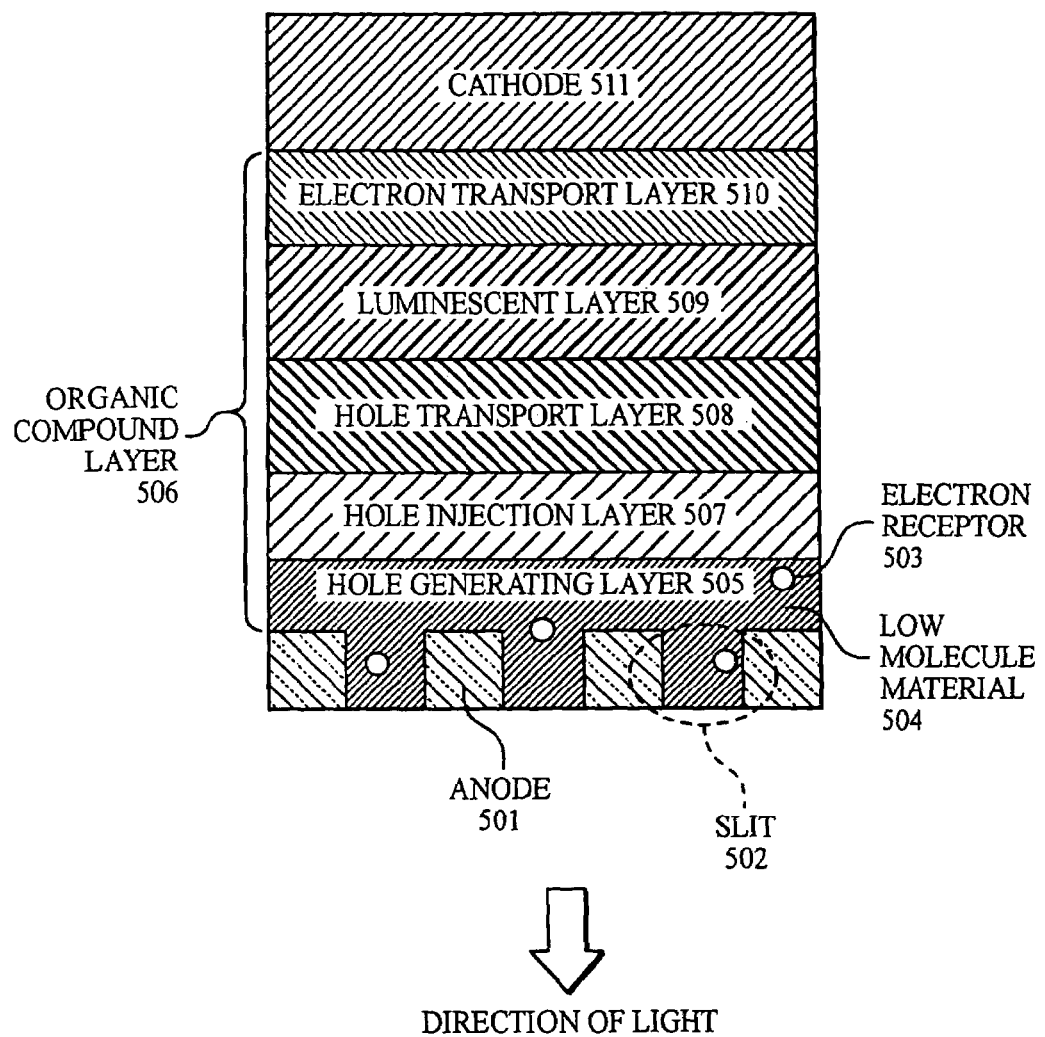
FIG. 5 is an element structure of a luminescent element.

Referring to FIG. 5, an element structure of a luminescent element which the luminescent device of the present invention has will be described in the present example.

In FIG. 5, reference number 501 represents an anode having slits 502. The anode 501 can be made of a metal film such as a platinum (Pt), chromium (Cr), tungsten (W) or nickel (Ni) film. In the present example, the thickness of the anode 501 is set to 30 nm.

Next, a hole generating layer 505 is formed by co-evaporating an electron receptor 503 and a low molecule material 504. In the present example, as the electron receptor, the same material as described in the above-mentioned embodiments can be used. However, as the low molecule material 504, a hole-injecting material is used.

As the hole-injecting material, a phthalocyanine material can be used, examples of which include copper phthalocyanine (CuPc) and non-metal phthalocyanine ($H_2PC$).

In the present example, a hole generating layer 505 made of the low molecule material 504, which is a hole-injecting material, and the electron receptor 503 is formed by co-evaporation, to have a thickness of 50 to 60 nm.

Next, a hole injection layer 507, a hole transport layer 508, a luminescent layer 509 and an electron transport layer 510 are successively deposited and formed.

The hole injection layer 507 is formed, using the hole-injecting material. In the present example, the same material as used in the low-molecule material when the hole generating layer is formed is used, and the film thickness of the layer 507 is set to 10 to 30 nm. By forming the hole generating layer and the hole injection layer using the same low molecule material in this way, the energy barrier which the two layers have can be relieved. Therefore, the movement of carriers can be made easy.

Next, a hole-transporting material is used to form the hole transport layer 508. In the present example, the following material is used as the hole-transporting material to form the layer 508 having a film thickness of 30 to 60 nm: an aromatic amine material such as 4,4'-bis[N-(1-naphthyl)-N-phenyl-amino]biphenyl (α-NPD), 1,1'-bis[4-bis(4-methylphenyl)-amino-phenyl]cyclohe xane (TPAC) or 4,4',4"-tris[N-(3-methylphenyl)-N-phenyl-amino]trip henylamine (MTDATA).

Next, a luminescent material is used to form the luminescent layer 509. In the present example, tris (8-quinolinolato) aluminum (hereinafter referred to as $Alq_3$), $Alq_3$ wherein a phenyl radical is introduced thereto, or the like is used as the luminescent material, to form this layer 509 having a film thickness of 30 to 60 nm. In the case that the luminescent layer 509 is doped with a dopant, a known material, such as perylene rubrene, coumalin, 4-(dicyanomethylene)-2-methyl-6-(p-dimethylaminostyryl)-4H-pyran (DCM) or quinacridon, is used as the dopant.

Furthermore, by co-evaporating CBP as the dopant and an iridium complex ($Ir(ppy)_3$) or a platinum complex which can give luminescence from triplet excitation state, the luminescent layer 509 can be formed. In this case, it is necessary to form a hole barrier layer between the luminescent layer 509 and the electron transport layer 510. As the material making the hole barrier layer, bathocuproin (hereinafter referred to as as BCP) is preferably used to form this layer 509 having a film thickness of 10 to 30 nm.

Next, an electron-transporting material is used to form the electron transport layer 510. In the present example, as the electron-transporting material, a 1,3,4-oxadiazole derivative, a 1,2,4-triazole derivative or the like can be used. Specifically, the following is used to form this layer 510 having a film thickness of 30 to 60 nm: p0 2-(4-biphenylyl)-5-(4-tert-butylphenyl)-1,3,4-oxadi zole (PBD), 2,5-(1,1'-dinaphthyl)-1,3,4-oxazole (BND), 1,3-bis[5-(p-tert-butylphenyl)-1,3,4-oxadiazole-2-y l]benzene (OXD-7),
3-(4-tert-butylphenyl)-4-phenyl-5-(4-biphenylyl)-1, 2,4-triazole (TAZ) or the like.

After the formation of the organic compound layer 506, a cathode 511 is formed by evaporation. In the present example, as a conductive film which becomes the cathode 511 of a luminescent element, a MgAg film is used. It is allowable to use an Al film, a Yb film, an Al—Li alloy film (an alloy film composed of aluminum and lithium), or a film formed by co-evaporating aluminum and a simple element belonging to the I or II group in the periodic table or a compound containing the simple element (CaF, BaF or the like).

As described above, the organic compound film having the lamination structure is formed on the anode in which the slits are made, and the same material can be used for the hole generating layer and the hole injection layer. The luminescent element described in the present example can be used in the luminescent device of the present invention.

Example 2

Figure 6:
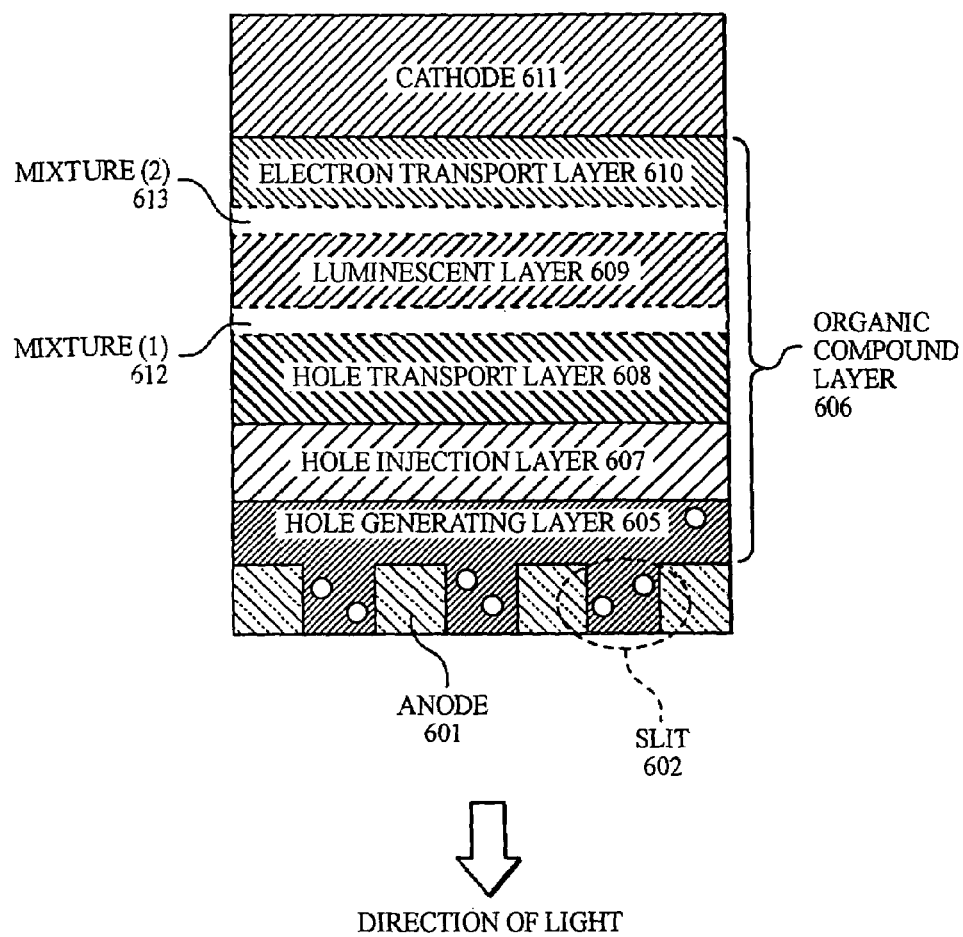
FIG. 6 is an element structure of a luminescent element.

Referring to FIG. 6, a case in which-mixture layers are formed in the luminescent element described in Example 1 will be described in the present example.

In FIG. 6, reference number 601 represents an anode having slits 602, and reference number 605 represents a hole generating layer formed by co-evaporating an electron receptor and a low molecule material.

A hole injection layer 607, a hole transport layer 608, a luminescent layer 609, and an electron transport layer 610 are successively deposited on the hole generating layer, whereby an organic compound layer 606 can be formed. For the formation thereof, it is advisable to refer to Example 1.

In the present example, mixture layers are formed between the luminescent layer 609 and the hole transport layer 608 contacting the luminescent layer 609, and between the luminescent layer 609 and the electron transport layer 610 contacting the luminescent layer 609.

In the present example, the mixture layer formed between the luminescent layer 609 and the hole transport layer 608 is called the mixture layer (1)612, and the mixture layer formed between the luminescent layer 609 and the electron transport layer 610 is called the mixture layer (2)613.

When the mixture (1)612 is formed, the material making the luminescent layer 609 and the material making the hole transport layer 608 are co-evaporated. When the mixture (1)612 is formed, the mixture ratio between these materials can be changed.

When the mixture (2)613 is formed, the material making the luminescent layer 609 and the material making the electron transport layer 610 are co-evaporated. When the mixture (2)613 is formed, the mixture ratio between these materials can also be changed.

As described above, by forming the structure wherein the mixture layers are fitted to the interfaces of the luminescent layer (specifically, the interface between the luminescent layer and the hole transport layer, and the interface between the luminescent layer and the electron transport layer), the capability of injecting holes from the hole transport layer 403 to the luminescent layer and the capability of injecting electrons from the electron transport layer to the luminescent layer can be improved, so that the capability of recombining the carriers in the luminescent layer can be improved.

Example 3

In the present example, a luminescence device wherein luminescent elements which emit red, green and blue light rays are formed will be described. In the present example, the hole generating layer 124 is formed as illustrated in FIG. 1E, and subsequently different materials are used in luminescent layers to form an organic compound layer emitting different color light rays. Since co-evaporation is used as all methods of forming the luminescence layers, the luminescent layers can be made from the materials different for respective pixels, using metal masks when the layers are formed.

In the present example, a metal mask is used to form luminescent layers emitting red light rays (hereinafter referred to as red color luminescent layers). As the material used to form the red color luminescent layers in the present example, a known material may be used. All of the red color luminescent layers formed in the luminescent device may be formed at the same time, or may be successively formed while the mask is stepwise shifted.

Next, a metal mask is used to form luminescent layers emitting green light rays (hereinafter referred to as green color luminescent layers). As the material used to form the green color luminescent layers in the present example, a known material may be used. All of the green color luminescent layers formed in the luminescent device may be formed at the same time, or may be successively formed while the mask is stepwise shifted.

Furthermore, a metal mask is used to form luminescent layers emitting blue light rays (hereinafter referred to as blue color luminescent layers). As the material used to form the blue color luminescent layers in the present example, a known material may be used. All of the blue color luminescent layers formed in the luminescent device may be formed at the same time, or may be successively formed while the mask is stepwise shifted.

As described above, the luminescent device wherein the luminescent elements emitting red, green and blue light rays are formed can be manufactured. The colors of the emitted light rays are not limited to those described in the present example. That is, a known material such as a material emitting white light rays or a material emitting orange light rays may be combined.

Example 4

Referring to FIG. 7, the external appearance of a luminescent device of the present invention will be described in the present example.

Figure 7A:
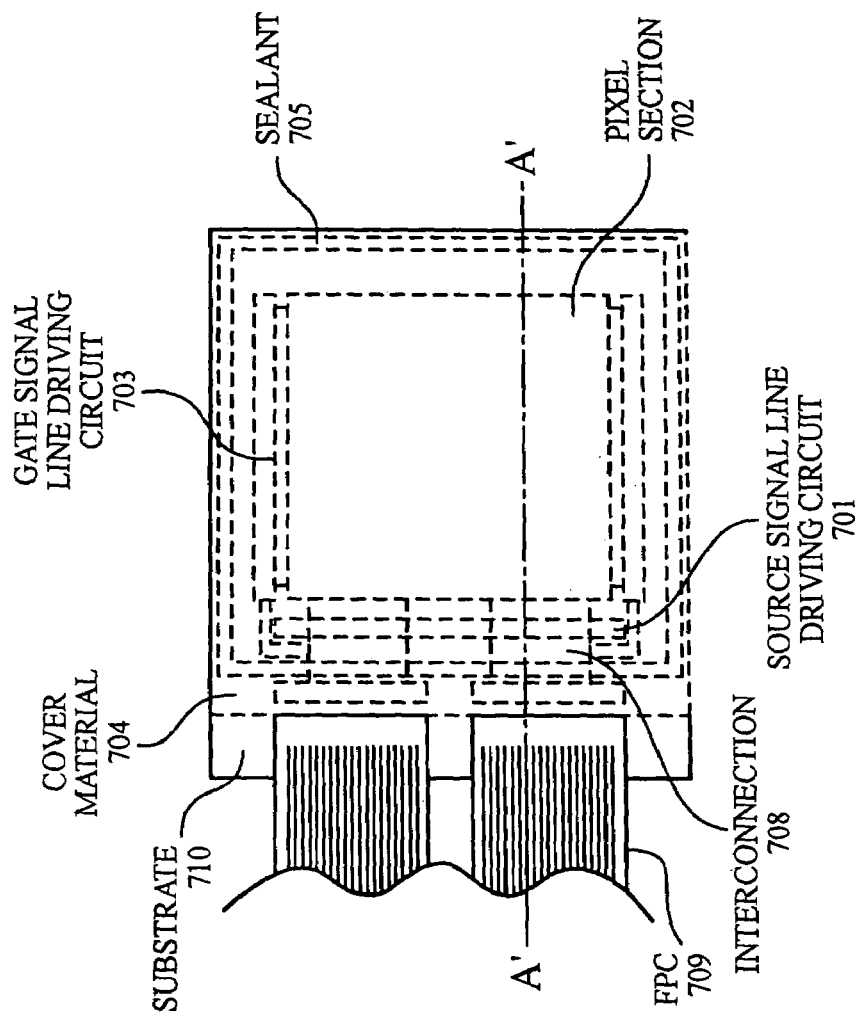
FIGS. 7A and 7B are views illustrating a top face structure and a sectional structure of a luminescent device.
Figure 7B:
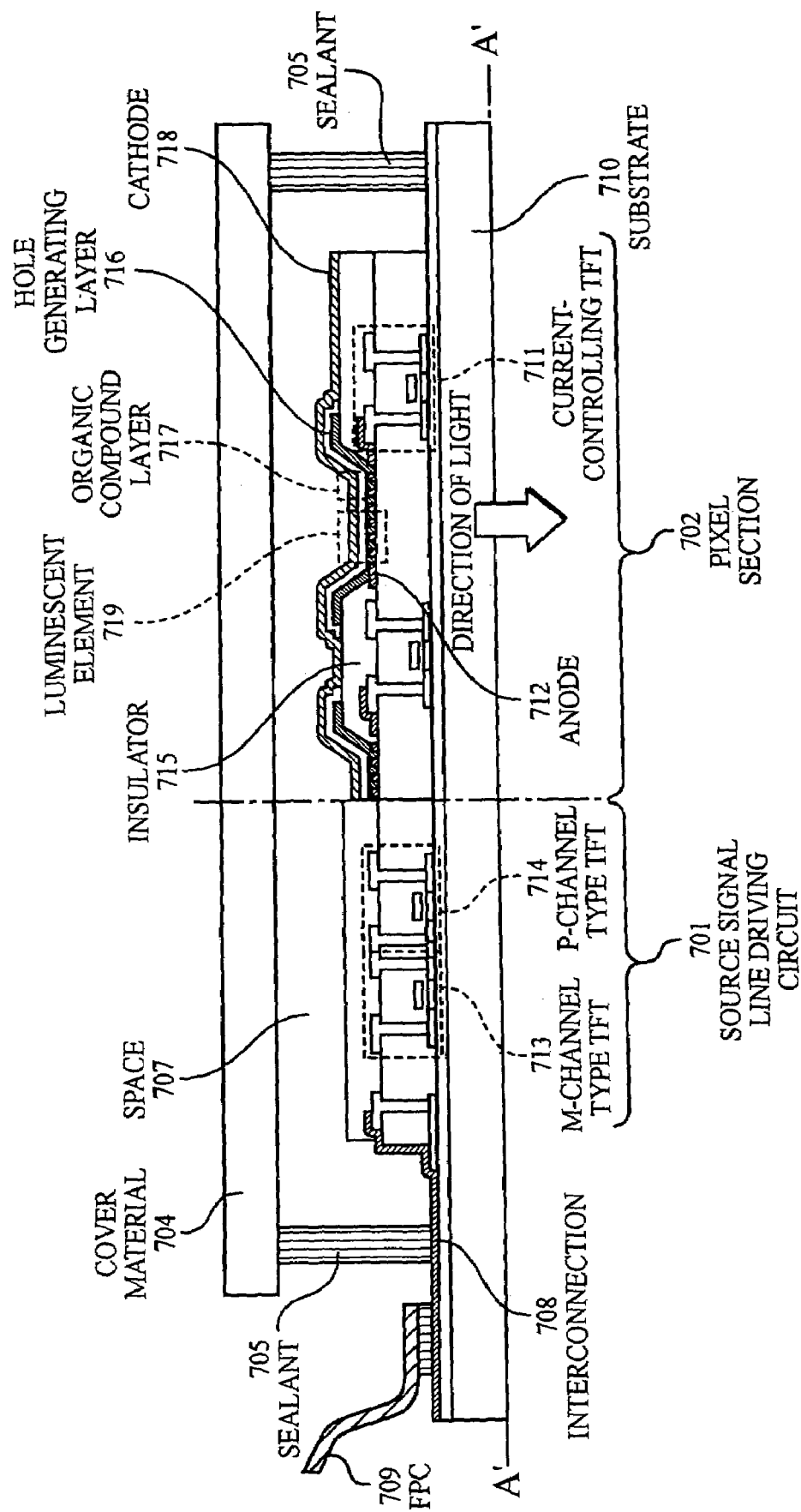

FIG. 7A is a top view of the luminescent device, and FIG. 7B is a sectional view taken on line A–A' of FIG. 7A. Reference number 701 represents a source signal line driving circuit, which is shown by a dotted line; 702, a pixel section; 703, a gate signal line driving circuit; 710, a substrate; 704, a cover material; and 705, a sealant. A space 707 is surrounded by the substrate 710, the cover material 704, and the sealant 705.

Reference number 708 represents an interconnection for transmitting signals inputted to the source signal line driving circuit 701 and the gate signal line driving circuit 703. The interconnection 708 receives video signals or clock signals from a flexible print circuit (FPC) 709, which will be an external input terminal. Only the FPC is illustrated, but a printed wiring board (PWB) may be attached to this FPC. The luminescent device referred to in the present specification may be the body of the luminescent device, or a product wherein an FPC or a PWB is attached to the body.

The following will describe a sectional structure, referring to FIG. 7B. The driving circuits and the pixel section are formed on the substrate 710, but the source signal line driving circuit 701 as one of the driving circuits and the pixel section 702 are shown in FIG. 7B.

In the source signal line driving circuit 701, a CMOS circuit wherein an n-channel type TFT 713 and a p-channel type TFT 714 are combined is formed. The TFTs constituting the driving circuit may be composed of known CMOS circuits, PMOS circuits or NMOS circuits. In the present example, a driver-integrated type, wherein the driving circuit is formed on the substrate, is illustrated, but the driver-integrated type may not necessarily be adopted. The driver may be fitted not to the substrate but to the outside.

The pixel section 702 is composed of plural pixels including a current-controlling TFT 711 and an anode 712 electrically connected to the drain of the TFT 711.

In the anode 712, slits are made. On the both sides of the anode 712, insulators 715 are formed, and an organic compound layer 717 composed of a hole generating layer 716, a hole injection layer, a hole transport layer, a luminescent layer and an electron transport layer is formed. Furthermore, a cathode 718 is formed on the insulators 715 and the organic compound layer 717. In this way, a luminescent element 719 composed of the anode, the organic compound layer and the cathode is formed.

The cathode also functions as an interconnection common to all of the pixels, and is electrically connected through the interconnection 708 to the FPC 709.

In order to confine the luminescent element 719 formed on the substrate 710 airtightly, the cover material 704 is adhered to the substrate 710 with the sealant 705. A spacer made of a resin film may be set up to keep a given interval between the cover material 704 and the luminescent element 719. An inert gas such as nitrogen is filled into the space 707 inside the sealant 705. As the sealant 705, an epoxy resin is preferably used. The sealant 705 is desirably made of a material through which water content or oxygen is transmitted as slightly as possible. Furthermore, it is allowable to incorporate a material having moisture absorption effect or a material having antioxidation effect into the space 707.

In the present example, as the material making the cover material 704, there may be used a glass substrate, a quartz substrate, or a plastic substrate made of fiber glass-reinforced plastic (FRP), polyvinyl fluoride (PVF), mylar, polyester or polyacrylic resin.

After the adhesion of the cover material 704 to the substrate 710 with the sealant 705, a sealant is applied so as to cover the side faces (exposure faces).

As described above, the luminescent element is airtightly put into the space 707, so that the luminescent element can be completely shut out from the outside and materials promoting deterioration of the organic compound layer, such as water content and oxygen, can be prevented from invading this layer from the outside. Consequently, the luminescent device can be made highly reliable.

When any one of the structures of Examples 1 to 3 is airtightly confined inside a space to manufacture a luminescent device, the structure of the present example may be freely combined with the structure.

Example 5

Figure 8A:
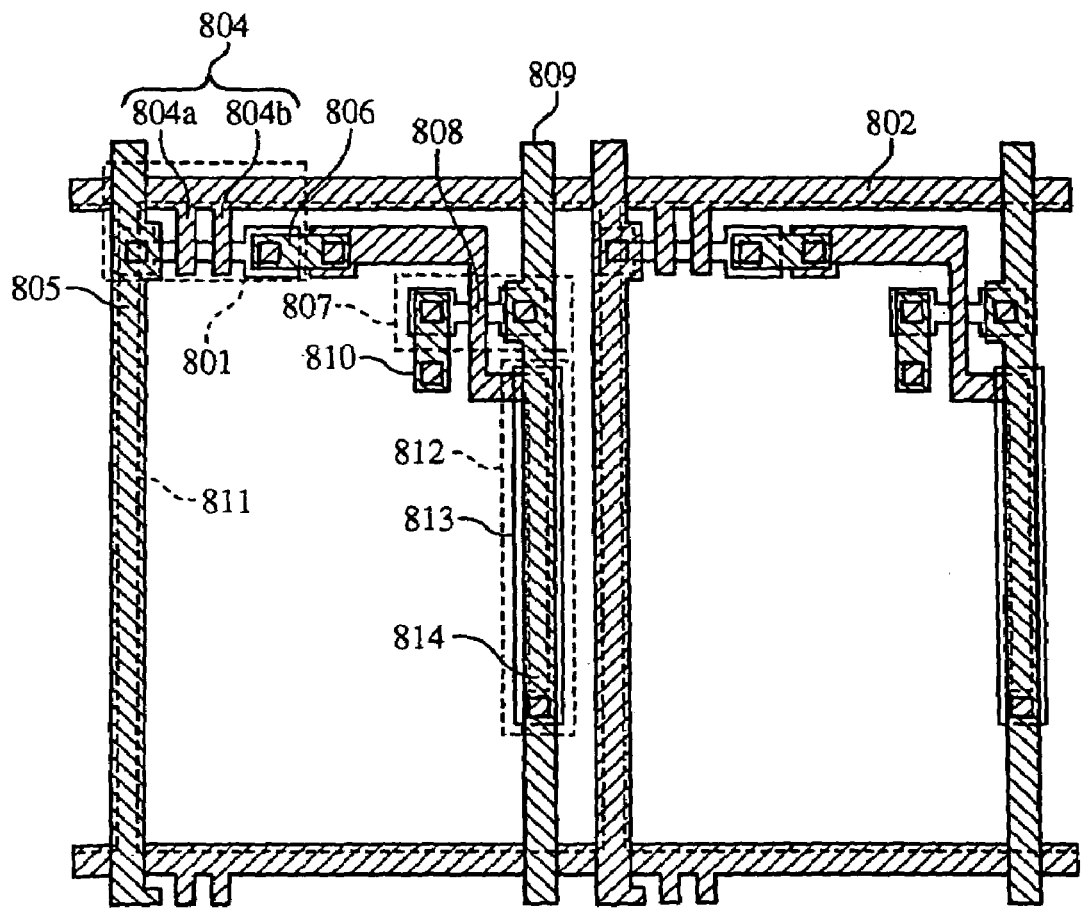
FIGS. 8A and 8B are views illustrating a circuit configuration of a luminescent device.
Figure 8B:
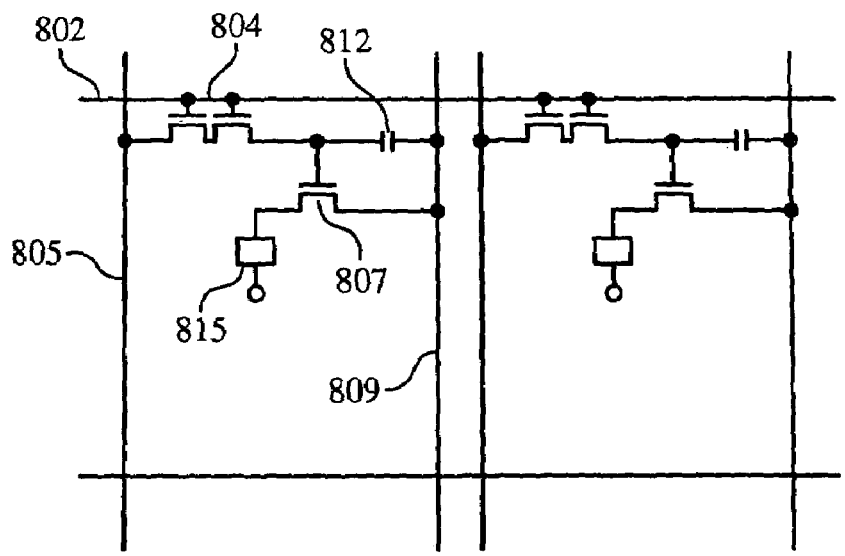

A luminescent device of the present invention can be made up to a pixel section illustrated in FIG. 8A. The circuit configuration of the device illustrated in FIG. 8A is illustrated in FIG. 8B.

In FIG. 8A, reference number 801 represents a switching TFT, which is an n-channel type TFT. An interconnection 802 is a gate interconnection for connecting gate electrodes 804 (804a and 804b) of the switching TFT 801 electrically.

In the present example, a double-gate structure, wherein two channel-formed areas are laid out, is adopted. However, a single-gate structure, wherein a single channel-formed area is formed, or a triple-gate structure, wherein three channel-formed areas are formed, may be adopted.

The source of the switching TFT 801 is connected to a source interconnection 805, and the drain thereof is connected to a drain interconnection 806. The drain interconnection 806 is electrically connected to a gate electrode 808 of the current-controlling TFT 807. The current-controlling TFT 807 is made up of a p-channel type TFT. In the present example, a single-gate structure is adopted. However, a double-gate structure or a triple-gate structure may be adopted.

In the present example, the switching TFT 801 is made up of an n-channel type TFT, and the current-controlling TFT 807 is made up of a p-channel type TFT. However, the switching TFT 801 may be made up of a p-channel type TFT, and the current-controlling TFT 807 may be made up of an n-channel type TFT. Both of them may be made up of n-channel type TFTs or p-channel type TFTS.

The source of the current-controlling TFT 807 is electrically connected to a current-supplying line 809, and the drain thereof is electrically connected to a drain interconnection 810. The drain interconnection 810 is electrically connected to an electrode (anode) 811 shown by a dotted line. By forming an organic compound layer and an electrode (cathode) on the electrode (anode) 811, a luminescent element 815 illustrated in FIG. 8B can be formed.

In a region 812, a retention capacitor (condenser) is formed. The condenser 812 is composed of a semiconductor film 813 electrically connected to the current-supplying line 809, an insulating film (not illustrated) as the same layer which constitutes the gate insulating film, and a capacitor electrode 814 electrically connected to the gate electrode 808. A capacitor composed of the capacitor electrode 814, the same layer (not illustrated) which constitutes an interlayer dielectric, and the current-supplying line 809 may be used as a retention capacitor.

The structure of the pixel section described in the present example may be combined instead of the pixel section described in Example 1.

Example 6

An example wherein a high molecule type hole generating layer composed of a high molecule material and an electron receptor is formed on an anode wherein slits are made will be described in the present example. In the present example, matters except the material which makes the hole generating layer and the method of forming the layer are the same as described in the above-mentioned embodiment.

As the high molecule material which makes the hole generating layer, a conjugated polymer as follows may be used: polyacetylene, polythiophene, poly(3-methyl)thiophene, poly(3-ethyl)thiophene, poly(3-n-butyl)thiophene, poly(3-hexyl)thiophene, poly(3-octyl)thiophene, poly(3-dodecyl)thiophene, poly(3-octadecyl)thiophene, poly(3-eicosyl)thiophene, poly(3-methyl-Co-butyl)thiophene, or the like. The polymer is dissolved or dispersed together with a dopant such as $PF_6^-$, bromine or iodine in a solvent, whereby a film can be formed.

Poly(3-hexyl)thiophene, poly(3-octyl)thiophene, poly(3-dodecyl)thiophene, poly(3-octadecyl)thiophene, poly(3-eicosyl)thiophene, and poly(3-methyl-Co-butyl)thiophene are soluble. As the solvent, chloroform, benzene, tetralin or the like can be used.

In the present example, a hole generating layer 124 is formed on an anode 122 in which slits are made, as illustrated in FIG. 1, so as to have a thickness of 30 to 50 nm. The material which makes the hole generating layer 124 is a soluble material. This material is formed into a film by printing or an inkjet process. In this way, irregularities, based on the slits, can be made flat and smooth.

Besides, the hole generating layer can be formed by spin-coating. In this case, a structure wherein the hole generating layer is shared by the adjacent electrodes (anodes) is produced. Therefore, it is necessary that by making the distance between the adjacent electrodes large, the resistance thereof is made sufficiently large and set to 1/10 or more of the resistance between electrodes (cathode) formed oppositely to the electrodes (anodes).

An organic compound layer 125 is formed on the hole generating layer 124 by combining a hole injection layer, a hole transport layer, a luminescent layer, and an electron transport layer. In the present example, the materials which make the hole injection layer, the hole transport layer, the luminescent layer, and the electron transport layer may be known materials.

After the organic compound layer 125 is formed in this way, an aluminum film containing lithium is formed as a cathode 126 thereon.

As described above, a luminescent element 127 composed of the anode 12.2, the organic compound layer 125 including the hole generating layer 124, and the cathode 126 is formed.

The structure of the present example may be combined with any one of the structures of Examples 1 to 9.

Example 7

A light-emitting device using a light-emitting element is self-luminous and therefore is superior in visibility in bright surroundings compared to liquid crystal display devices and has wider viewing angle. Accordingly, it can be used for display portions of various electric equipments.

Given as examples of electric equipment employing a light-emitting device formed by the present invention is applied are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game machine, an electronic book, etc.); and an image reproducing device (specifically, a device equipped with a display device which can reproduce a recording medium such as a digital versatile disk (DVD), and can display the image). The light-emitting device having a light-emitting element is desirable particularly for a portable information terminal since its screen is often viewed obliquely and is required to have a wide viewing angle.

Specific examples of the electric equipment are shown in FIGS. 9A to 9H.

Figure 9A:
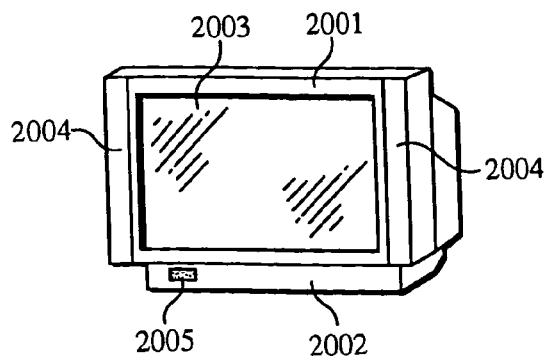
FIGS. 9A to 9H are views illustrating examples of an electric apparatus.

FIG. 9A shows a display device, which comprises a casing 2001, a supporting base 2002, a display portion 2003, speaker portions 2004, a video input terminal 2005, etc. The light-emitting device formed by the present invention can be used for the display portion 2003. The light-emitting device having a light-emitting element is self-luminous and does not need a backlight, so that it can make a thinner display portion than liquid display devices can. The term display device includes every display device for displaying information such as one for a personal computer, one for receiving TV broadcasting, and one for advertisement.

Figure 9B:
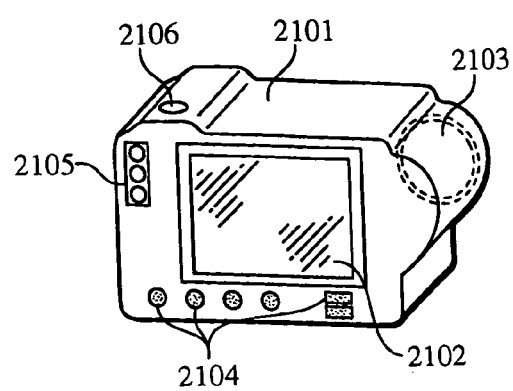

FIG. 9B shows a digital still camera, which comprises a main body 2101, a display portion 2102, an image receiving portion 2103, operation keys 2104, an external connection port 2105, a shutter 2106, etc. The light-emitting device formed by the present invention can be used for the display portion 2102.

Figure 9C:
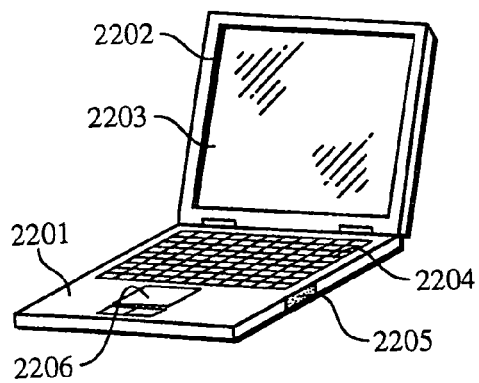

FIG. 9C shows a laptop computer, which comprises a main body 2201, a casing 2202, a display portion 2203, a keyboard 2204, an external connection port 2205, a pointing mouse 2206, etc. The light-emitting device formed by the present invention can be used for the display portion 2203.

Figure 9D:
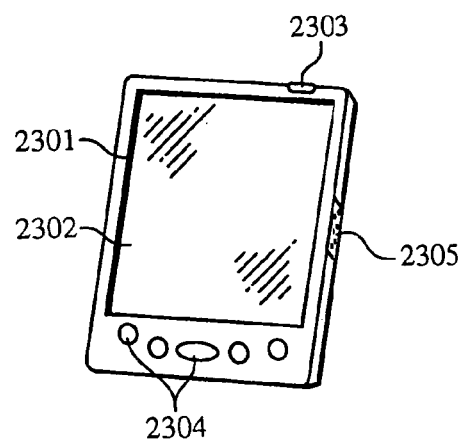

FIG. 9D shows a mobile computer, which comprises a main body 2301, a display portion 2302, a switch 2303, operation keys 2304, an infrared ray port 2305, etc. The light-emitting device formed by the present invention can be used for the display portion 2302.

Figure 9E:
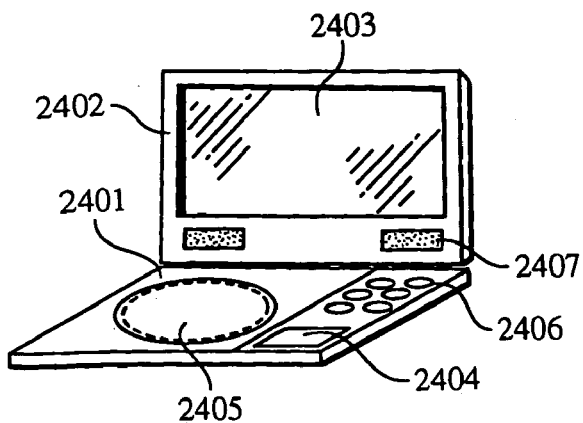

FIG. 9E shows a portable image reproducing device equipped with a recording medium (a DVD player, to be specific). The device comprises a main body 2401, a casing 2402, a display portion A 2403, a display portion B 2404, a recording medium (DVD) reading portion 2405, operation keys 2406, speaker portions 2407, etc. The display portion A 2403 mainly displays image information whereas the display portion B 2404 mainly displays text information. The light-emitting device formed by the present invention can be used for the display portions A 2403 and B 2404. The term image reproducing device equipped with a recording medium includes video game machines.

Figure 9F:
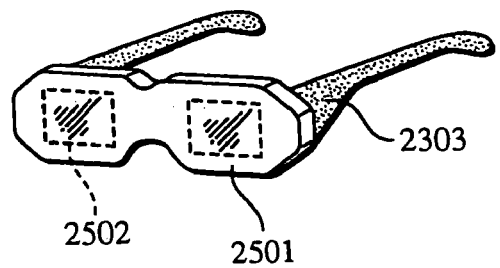

FIG. 9F shows a goggle type display (head mounted display), which comprises a main body 2501, display portions 2502, and arm portions 2503. The light-emitting device formed by the present invention can be used for the display portions 2502.

Figure 9G:
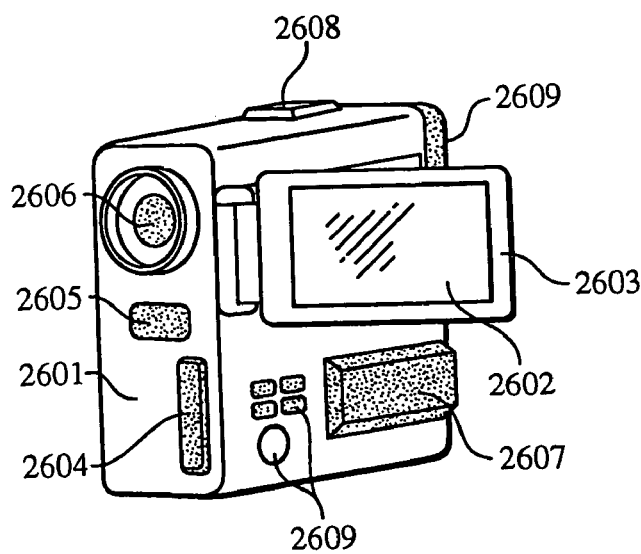

FIG. 9G shows a video camera, which comprises a main body 2601, a display portion 2602, a casing 2603, an external connection port 2604, a remote control receiving portion 2605, an image receiving portion 2606, a battery 2607, an audio input portion 2608, operation keys 2609, etc. The light-emitting device formed by the present invention can be used for the display portion 2602.

Figure 9H:
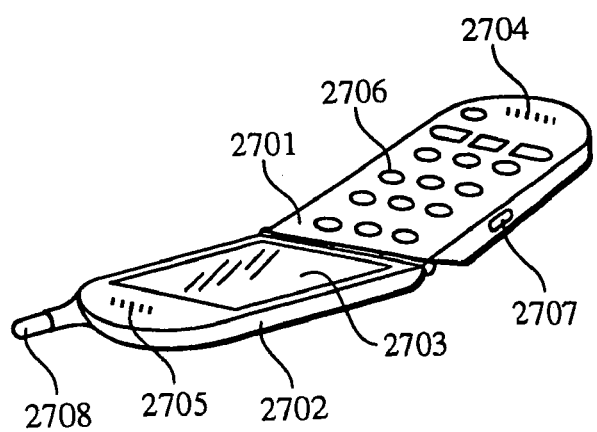

FIG. 9H shows a cellular phone, which comprises a main body 2701, a casing 2702, a display portion 2703, an audio input portion 2704, an audio output portion 2705, operation keys 2706, an external connection port 2707, an antenna 2708, etc. The light-emitting device formed by the present invention can be used for the display portion 2703. If the display portion 2703 displays white characters on a black background, power consumption of the cellular phone can be reduced.

If the luminance of light emitted from organic materials is increased in future, the light-emitting device having a light-emitting element can be used also in a front or rear projector in which light bearing outputted image information is magnified by a lensor the like to be projected on a screen.

The electric equipment given in the above often displays information distributed through electronic communication lines such as Internet and CATV (cable television), especially, animation information with increasing frequency. The light-emitting device having a light-emitting element is suitable for displaying animation information since organic materials have fast response speed.

In the light-emitting device, portions that emit light consume power. Therefore, it is desirable to display information such that as small portions as possible emit light. Accordingly, if the light-emitting device is used for a display portion that mainly displays text information such as a portable information terminal, in particular, a cellular phone, and an audio reproducing device, it is desirable to assign light-emitting portions to display text information while portions that do not emit light serve as the background.

As described above, the application range of the light-emitting device to which the present invention is applied is very wide and electric equipment of every field can employ the device. The electric equipments in this example may use the light-emitting device formed in Examples 1 to 6 to the display portion thereof.

As described above, by making slits in an anode of a luminescent element, it is unnecessary to require the material of the anode to have transparency. Therefore, the scope from which a low-resistance material used as the anode material is selected becomes wide.

By forming a hole generating layer on the anode, a subsequently-formed organic compound layer other than the hole generating layer can be made homogeneous so that deterioration of the luminescent element can be prevented. Moreover, the hole generating layer is made up of a semiconductive film; therefore, an electric field applied to the organic compound layer can be made uniform.

Furthermore, because of the generation of holes in the hole generating layer, the density of the holes flowing when the holes are injected to the layer by the application of voltage from the anode can be made high; therefore, the driving voltage of the luminescent element can be made lower than that of conventional elements and the luminescent brightness thereof can be made higher than that of the conventional elements. By using a luminescent device having such a luminescent element as a display unit, an electric apparatus having high performance can be obtained.

What is claimed is:

1. A luminescent device comprising:
    an anode provided over a substrate and having at least one slit;
    a cathode provided over said substrate;
    a layer comprising an organic compound provided between said anode and said cathode;
    a current-controlling thin film transistor;
    a current-supplying line provided over said substrate and connected with a semiconductor layer formed at the same time with an active layer of said current-controlling thin film transistor;
    an interconnection provided over said substrate and making a gate electrode of said current-controlling thin film transistor;
    a capacitor comprising said semiconductor layer and said interconnection and a gate insulating layer of said current-controlling thin film transistor, said gate insulating layer provided over said substrate;
    wherein said semiconductor layer is connected with said current-supplying line; and
    wherein said current-supplying line overlaps with said semiconductor layer.

2. A device according to claim 1 wherein said layer comprising said organic compound comprises a luminescent layer and a hole generating layer.

3. A device according to claim 1 wherein a source of said current-controlling thin film transistor is connected with said current-supplying line.

4. A device according to claim 1 wherein a drain of said current-controlling thin film transistor is connected with a drain interconnection which is connected with said anode.

5. A device according to claim 1 wherein said capacitor is connected between said current-supplying line and a source of said current-controlling thin film transistor.

6. A device according to claim 1 wherein said layer comprising said organic compound comprises a luminescent layer provided over said anode, and a light generated in said luminescent layer is transmitted through said slit and is transmitted through said substrate.

7. A device according to claim 1 wherein said luminescent device is incorporated into one selected from the group consisting of a display device, a camera, a laptop computer, a mobile computer, a portable image reproducing device equipped with a recording medium, a goggle type display and a cellular phone.

8. A luminescent device comprising:
    an anode provided over a substrate and having at least one slit;
    a cathode provided over said substrate;
    a layer comprising an organic compound provided between said anode and said cathode;
    a current-controlling thin film transistor;
    a current-supplying line provided over said substrate and connected with a semiconductor layer formed at the same time with an active layer of said current-controlling thin film transistor;
    an interconnection provided over said substrate and making a gate electrode of said current-controlling thin film transistor;
    a capacitor comprising said semiconductor layer and said interconnection and a gate insulating layer of said current-controlling thin film transistor, said gate insulating layer provided over said substrate;
    wherein said semiconductor layer is connected with said current-supplying line,
    wherein said current-supplying line overlaps with said semiconductor layer, and
    wherein said anode comprises a material selected from the group consisting of platinum, chromium, tungsten, and nickel.

9. A device according to claim 8 wherein said layer comprising said organic compound comprises a luminescent layer and a hole generating layer.

10. A device according to claim 8 wherein a source of said current-controlling thin film transistor is connected with said current-supplying line.

11. A device according to claim 8 wherein a drain of said current-controlling thin film transistor is connected with a drain interconnection which is connected with said anode.

12. A device according to claim 8 wherein said capacitor is connected between said current-supplying line and a source of said current-controlling thin film transistor.

13. A device according to claim 8 wherein said layer comprising said organic compound comprises a luminescent layer provided over said anode, and a light generated in said luminescent layer is transmitted through said slit and is transmitted through said substrate.

14. A device according to claim 8 wherein said luminescent device is incorporated into one selected from the group consisting of a display device, a camera, a laptop computer, a mobile computer, a portable image reproducing device equipped with a recording medium, a goggle type display and a cellular phone.

15. A luminescent device comprising:
- a semiconductor film provided over a substrate and comprising a source region and a drain region and a channel region therein, said channel region provided between said source region and said drain region;
- a gate electrode provided over said substrate and adjacent to said channel region with a gate insulating layer therebetween;
- an anode provided over said substrate and having at least one slit and connected with said drain region;
- a layer comprising an organic compound provided over said anode;
- a cathode provided over said layer comprising said organic compound;
- a current-supplying line provided over said substrate and connected with a semiconductor layer formed at the same time with said semiconductor film comprising said source region and said drain region and said channel region;
- an interconnection provided over said substrate and making said gate electrode;
- a capacitor comprising said semiconductor layer and said interconnection and said gate insulating layer;
- wherein said semiconductor layer is connected with said current-supplying line; and
- wherein said current-supplying line overlaps with said semiconductor layer.

16. A device according to claim 15 wherein said layer comprising said organic compound comprises a luminescent layer and a hole generating layer.

17. A device according to claim 15 wherein said source region is connected with said current-supplying line.

18. A device according to claim 15 wherein said capacitor is connected between said current-supplying line and said source region.

19. A device according to claim 15 wherein said layer comprising said organic compound comprises a luminescent layer provided over said anode, and a light generated in said luminescent layer is transmitted through said slit and is transmitted through said substrate.

20. A device according to claim 15 wherein said luminescent device is incorporated into one selected from the group consisting of a display device, a camera, a laptop computer, a mobile computer, a portable image reproducing device equipped with a recording medium, a goggle type display and a cellular phone.

* * * * *